(12) United States Patent
Willmeroth

(10) Patent No.: US 6,861,723 B2
(45) Date of Patent: Mar. 1, 2005

(54) SCHOTTKY DIODE HAVING OVERCURRENT PROTECTION AND LOW REVERSE CURRENT

(75) Inventor: Armin Willmeroth, Augsburg (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/741,825

(22) Filed: Dec. 19, 2003

(65) Prior Publication Data

US 2004/0173801 A1 Sep. 9, 2004

(51) Int. Cl.[7] .............................................. H01L 27/095
(52) U.S. Cl. ....................................... 257/471; 257/472
(58) Field of Search ................................. 257/471–473, 257/481–486

(56) References Cited

U.S. PATENT DOCUMENTS

2002/0125482 A1  9/2002  Friedrichs et al.

FOREIGN PATENT DOCUMENTS

WO      WO 00/74130 A1    12/2000
WO      WO 01/22498 A1    3/2001

*Primary Examiner*—Sara Crane
(74) *Attorney, Agent, or Firm*—Maginot, Moore & Beck

(57) ABSTRACT

The invention relates to a Schottky diode in which p-doped regions (4, 5) are incorporated in the Schottky contact area. At least one (5) of these regions (4, 5) has a greater minimum extent, in order to initiate a starting current.

20 Claims, 4 Drawing Sheets

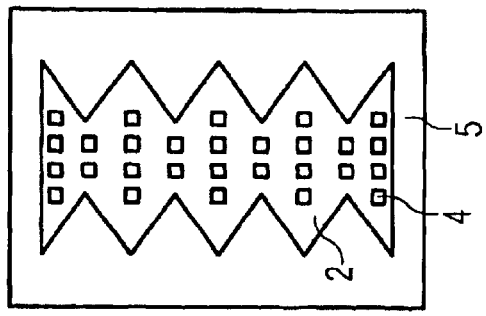
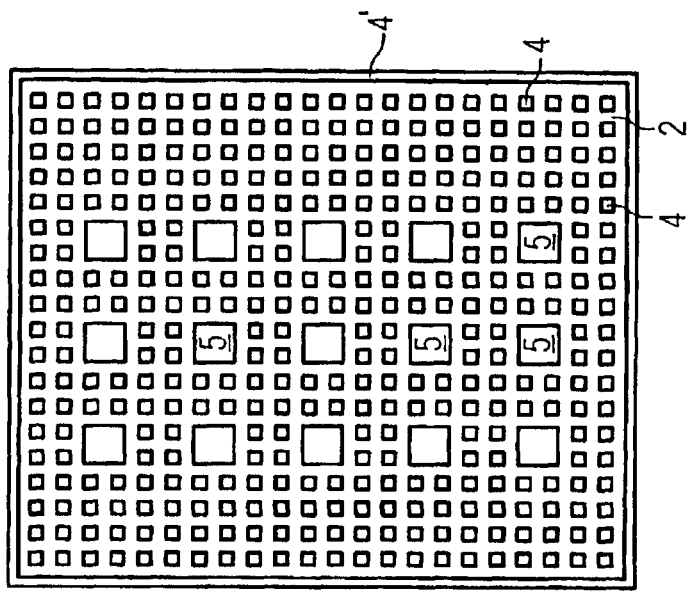
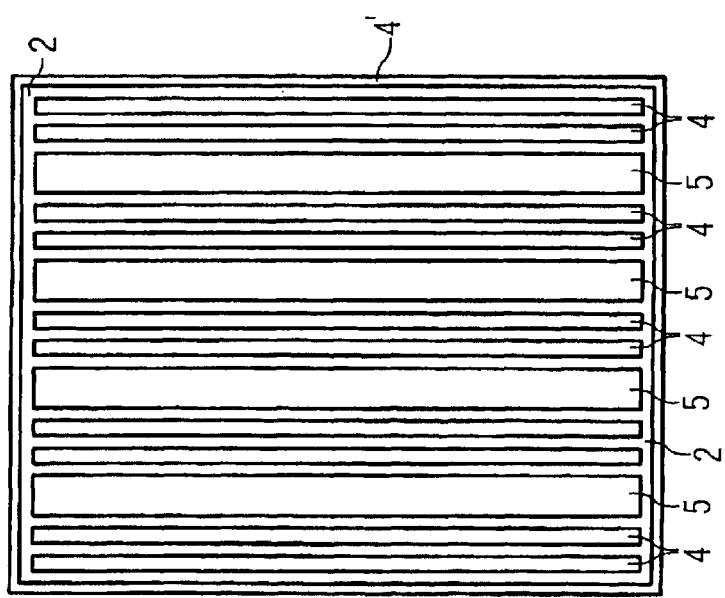

SCHOTTKY DIODE HAVING OVERCURRENT PROTECTION AND LOW REVERSE CURRENT

FIELD OF THE INVENTION

The present invention relates to a Schottky diode having a semiconductor body of a first conductance type, having a Schottky contact which is provided on the semiconductor body, and having two or more regions of the other conductance type, which are located in the semiconductor body underneath the Schottky contact and are at least partially adjacent to the Schottky contact.

BACKGROUND

Conventional Schottky diodes have the characteristic that, when they are loaded with a voltage in the reverse direction, the greatest electrical field strength occurs directly adjacent to the surface of the Schottky contact. This means that a considerably increased leakage current occurs in Schottky diodes even considerably below the theoretical breakdown field strength of its semiconductor material. In addition to silicon, silicon carbide (SiC), for example, may also be used as the semiconductor material.

As a result of the above characteristic, Schottky diodes are in practice designed such that the electrical field strength in them remains considerably below the theoretically achievable breakdown field strength even at the rated voltage. This reduced electrical field strength at the rated voltage may be achieved by means of a reduced dopant concentration in the semiconductor body of the Schottky diode and/or by designing the drift path to be longer, that is to say by designing the semiconductor body to be thicker, and/or by the use of a Schottky contact with a high energy barrier for the charge carriers. Thus, for example, U.S. Pat. No. 5,262,668 describes a Schottky diode with areas having different energy barriers.

All of these measures for reducing the electrical field strength at the rated voltage lead, however, to the forward voltage of the Schottky diode being considerably greater than it would need to be without the measures taken to overcome the surface problems explained above.

A further problem, in particular in the case of silicon carbide Schottky diodes, is their relatively low resistance to overcurrents. The forward voltage of silicon carbide Schottky diodes is approximately proportional to $T^{2.5}$ (T: Temperature), so that considerable values are reached even at room temperature. In numerous applications, for example for PFC (Power Factor Correction) purposes, however, better resistance to overcurrents is, however, required in some operating states. Such a greater resistance to overcurrents would make it possible to use smaller silicon carbide Schottky diodes. This is because, at the moment, the Schottky diodes are often chosen on the basis of the resistance to overcurrents required for their application, and they are thus derated.

It is now known from "Power Semiconductor Devices" by B. Jayant Baliga, PWS Publishing, 1995, pages 182 to 195 that, in the case of silicon Schottky diodes with an n-doped drift path, the surface field strength adjacent to the Schottky contact can be reduced considerably, when it is reverse-biased, by introducing p-doped regions on the surface of one face of the Schottky diode and with the distances between these regions being suitably matched, that is to say the p-doped regions are located in the n-doped area. Such p-doped regions have already been proposed, for example, as raised islands (see U.S. Pat. No. 4,982,260), as a combination of pn junctions and Schottky junctions (see U.S. Pat. No. 5,101,244) and as doping on side walls and at the bottom of a trench (see U.S. Pat. No. 5,241,195).

Furthermore, pinch structures with highly doped n-conductive regions (U.S. Pat. No. 4,641,174) and compensation structures with p-doped columns (DE 197 40 195 C2) have also already been described for Schottky diodes in a semiconductor body.

The incorporation of such p-doped regions in a rectangular grid has also already been generally considered in conjunction with silicon carbide Schottky diodes (see, in this context, the article "Comparison of 4H SiC pn, Pinch and Schottky Diodes for the 3 kv Range" by Peters, Friedrichs, Schörner, Stephani in Materials Science Forum, Volume 389–393, pages 1125–1128). The reduction in the electrical field strength immediately adjacent to the Schottky contact area as a consequence of the incorporation of p-doped regions in the otherwise n-doped semiconductor body means that the Schottky diodes may be designed to have higher doping, which reduces the forward voltage.

An additional advantage of these p-doped regions is that they are suitably dimensioned such that, when the current density of the current flowing through the Schottky diode is relatively high, the p-doped regions inject charge carriers, and thus ensure that the voltage drop is considerably less. The current density for this "starting" of the injection process is in general designed to be sufficiently high that the diode operates only as a Schottky diode at the rated current, and that bipolar conduction resulting from the injection process occurs only in the event of overcurrents, for example at twice the rated current.

The starting current for the bipolar injection process is, to a first approximation, proportional to the n-dopant concentration in the semiconductor body, and is inversely proportional to the minimum distance between the center of the p-doped region and the closest n-doped region, that is to say is inversely proportional to the minimum extent of the p-doped regions.

This means that, if the n-dopant concentrations are relatively high, the p-doped regions must be made broader in order to reduce the forward voltage. Specifically, in order to achieve a shielding effect for the electrical field on the surface, the distance between the p-doped regions must be reduced correspondingly if the n-dopant concentration is relatively high, in order to achieve the desired effect at all points on the Schottky content.

The higher dopant concentration in the n-doped semiconductor body thus means that the p-doped regions must be larger and must be placed closer together. This in turn leads to a considerable loss of surface area for the active Schottky part of the diode, and thus to a major rise in the forward voltage.

Thus, overall, it is virtually impossible for relatively small reverse voltages to find suitable dimensions for Schottky diodes, which at the same time also produce a low forward voltage while achieving a good shielding effect and good resistance to overcurrents. No solution to this problem has been found until now, or has even been considered to be possible, so that the problem has been accepted as such.

SUMMARY

The object of the present invention is thus to provide a Schottky diode which is distinguished by having good resistance to overcurrents, and a low forward voltage at the same time.

For a Schottky diode of the type mentioned initially, this object is achieved according to the invention in that in order to initiate the injection of a starting current, at least one of the regions of the other conductance type is designed such that the minimum distance between the center of the at least one region and an area of the first conductance type is considerably greater than the corresponding minimum distance between the other regions of the other conductance type. This greater minimum distance means that the at least one region of the other conductance type has a substantially greater minimum extent than the other regions of the other conductance type.

The first conductance type is preferably the n-conductance type, so that the other conductance type, that is to say the conductance type of the regions which are located in the semiconductor body and are adjacent to the Schottky contact, is the p-conductance type. The conductance types may in principle, however, also each be reversed.

The semiconductor body is preferably composed of silicon carbide. However, the invention is not restricted to this. In fact, the semiconductor body may also be composed of any other suitable semiconductor material, for example silicon, compound semiconductors, etc.

However, the following text is based on the assumption that the semiconductor body is composed of silicon carbide and is n-doped. This means that p-doped regions are embedded in the surface area of the semiconductor body and of the drift path of the diode, adjacent to the Schottky contact.

A feature of the Schottky diode according to the invention is the fundamental idea that the starting area for the gradient or the resistance to overcurrents should be restricted to a small part of the diode surface, thus avoiding a large loss of area for the active Schottky part of the diode, and preventing a severe rise in the forward voltage. Since the p-doped regions are at least partially cohesive, it is possible to ensure that the starting process propagates rapidly. This allows a particularly significant reduction in the forward voltage to be combined in a very simple manner with good resistance to overcurrents.

A considerably greater minimum distance for the at least one p-doped region than for the minimum distances for the other p-doped regions can be achieved in a simple manner by providing the at least one p-doped region with a larger area than the areas of any of the other p-doped regions.

"Considerably greater" should preferably be regarded as meaning a distance which is preferably greater by a factor of at least 1.5, or an extent which is greater than that factor. In practice, however, this factor may actually also have considerably higher values, for example 10 or 20 or more. If required, however, it may also be smaller.

The number of regions having a greater minimum distance is at least one. However, two or more regions with a greater minimum distance may also be provided, for example 5, 10 or 20 such regions.

If the embedded p-doped regions have a structure which is in the form of strips, they may be designed to have different widths. For example, this makes it possible for two narrow regions which are in the form of strips and one broad region which is in the form of a strip to in each case alternate with one another. However, it is also possible to incorporate only one region, in the form of a strip, as a starting surface. The narrow regions which are in the form of strips may in this case be sufficiently narrow to allow the respectively used technology.

The distance between the other p-doped regions, that is to say, in the case of a structure in the form of a strip, the distance between narrow p-doped regions, is chosen so as to achieve shielding for the electrical field on the surface. The minimum distance for the at least one p-doped region, that is to say, for a structure which is in the form of strips, half the width of the starting area, can then be designed independently of the dimensions of the narrow p-doped regions which are in the form of strips, such that starting occurs above the rated current.

As has already been mentioned above, it is highly advantageous for propagation of the starting process for the p-doped regions to be cohesive since, then, the current propagation over the cohesive p-doped region takes place considerably more quickly than in the case of regions which are not cohesive.

If an annular p-doped region is incorporated at the edge of the Schottky diode, then this makes it possible to ensure that the starting process propagates particularly quickly over the entire diode area. Furthermore, a region such as this is advantageous in terms of edge effects. The edge should thus be p-conductive when p-conductive regions are incorporated in an n-conductive semiconductor body.

Since, in the case of the Schottky diode according to the invention, the starting area occupies only a small proportion of the diode, the active Schottky part of the diode is scarcely adversely affected. This adverse effect is never greater than it would be in any case just from the shielding effect and the very small possible geometry.

The Schottky contact may be cohesive or interrupted. If is it interrupted, the individual parts can be electrically joined together at the edge.

The invention will be explained in more detail in the following text with reference to the drawings, in which:

BRIEF DESCRIPTION OF THE DRAWINGS

FIGS. 2 to 8 shows plan views of further exemplary embodiments of the Schottky diode according to the invention (in each case showing the semiconductor body with the p-doped regions).

DETAILED DESCRIPTION

Figure 1A:
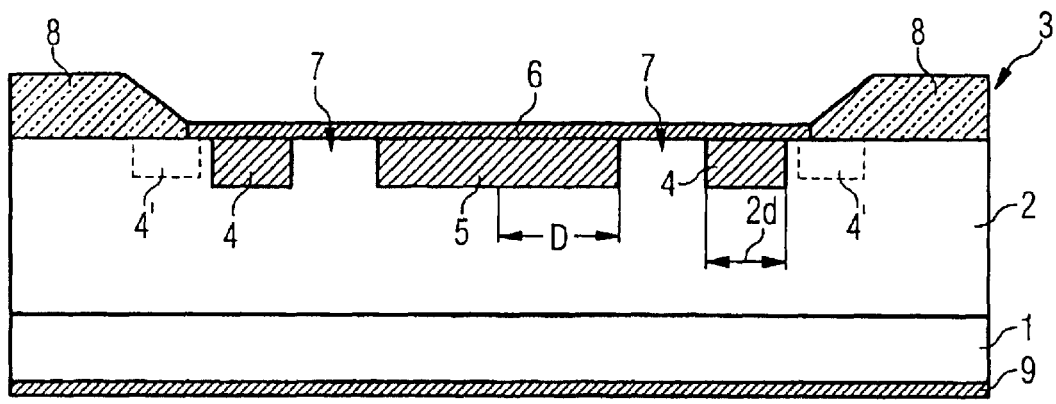
FIGS. 1A and 1B show a section illustration (FIG. 1A) and a reduced-scale plan view (FIG. 1B; without the isolation layer and the Schottky contact), respectively, of a Schottky diode according to a first exemplary embodiment of the invention.

FIG. 1A shows, on an n-doped silicon carbide substrate 1, an n-doped silicon carbide layer 2, which is, for example, deposited epitaxially and in whose surface area p-doped regions 4, 5 which are in the form of strips are incorporated. The width of the region 5 which is in the form of strips is in this case greater by a factor of 3 than the width of the regions 4 which are in the form of strips.

The edge should preferably be p-conductive. This can be achieved, for example, by means of an additional p-conductive region 4', which may be cohesive with the region 4 closest to it, or alternatively may be separate from it. However, it is likewise also possible to provide a region 4 directly as the edge. The region 4' may also be doped more strongly or more weakly than the region 4.

Figure 1B:
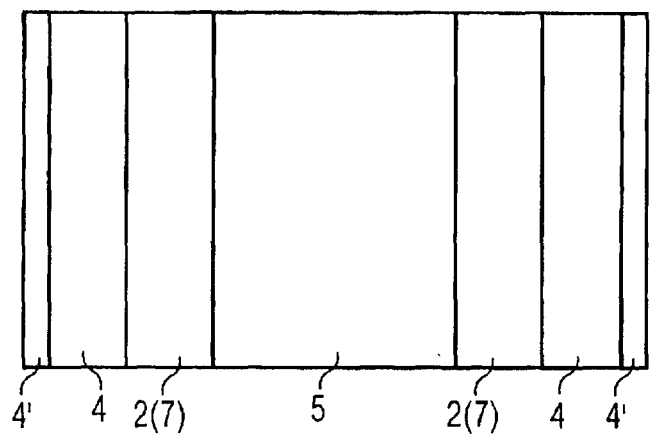

Even though only one broad region 5 and two narrow regions 4 are provided in FIGS. 1A and 1B, it is self-evident that considerably more narrow regions 4 as well as more than one broad region 5 may be provided.

The minimum distance D from the central line of the regions 5 in the horizontal direction as far as the closest n-conductive area, that is to say half the width of the region 5, is greater than the corresponding minimum distance d to the region 4 by a factor of somewhat more than 3, for example. In a corresponding manner, the minimum extent of the region 5, that is to say its width, is in this exemplary embodiment greater by a factor of approximately 3 than the minimum extent of the other regions 4, that is to say their width. The minimum extent or the width of the region 5 is thus chosen such that this region 5 acts as a starting area, and starting takes place above the rated current of the Schottky diode.

The center of the region 5 should not be located exclusively in the transitional area between an active area of the Schottky diode and its edge area. The region 5 with the greatest minimum extent should thus preferably be located to a greater extent in the active, that is to say central, area, and not in the edge area of the diode.

The Schottky diode shown in FIG. 1A also has metallization 6 in the normal manner, which, together with the layer 2, forms a Schottky contact (see the arrows 7), an isolation layer 8, composed, for example, of silicon dioxide, around the Schottky metallization and an opposing electrode 9 on the substrate 1.

Nickel may be chosen, for example, for the opposing electrode 9, while the metallization 6 is composed, for example, of titanium. However, other materials may also be used, such as gold or platinum for the metallization 6, and aluminum for the opposing electrode 9.

Figure 1C:
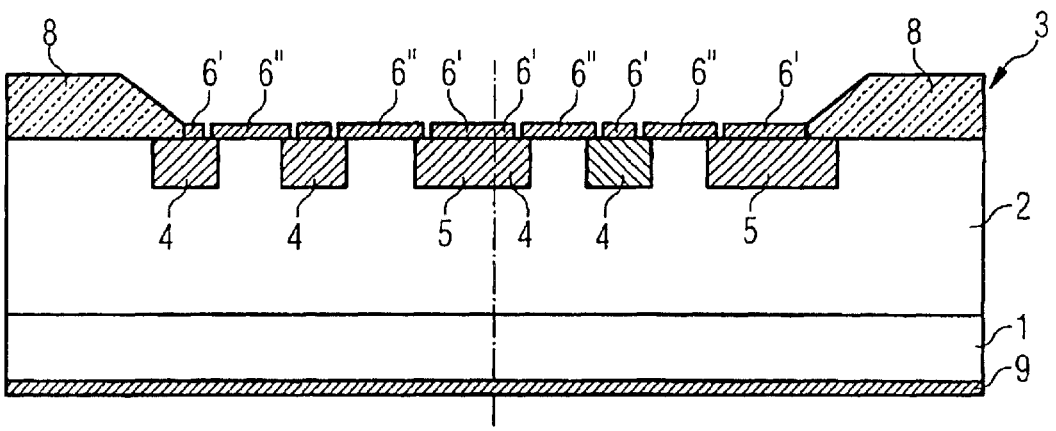
FIG. 1C shows a section illustration in order to explain two further exemplary embodiments of the invention with an interrupted Schottky contact.

The left-hand half of FIG. 1C shows one exemplary embodiment of the Schottky diode, in which the "broad" region is located in the center and the edge is formed by a narrow region 4, while the right-hand half illustrates an exemplary embodiment in which the broad region 5 is provided at the edge, and the side area is occupied by narrow regions 4 (the axis of symmetry is in each case the dashed-dotted line). In both of the exemplary embodiments in FIG. 1C, the metallization 6 is interrupted, so that metallization areas 6' are provided for the regions 4, 5 and metallization areas 6" are provided for the Schottky contacts. If necessary, different material may be used for the metallization areas 6' and 6". The metallization area 6" is preferably composed of titanium, as is the metallization area 6. The metallization areas 6' and 6" are, for example, electrically joined together at the edge.

Figure 2:
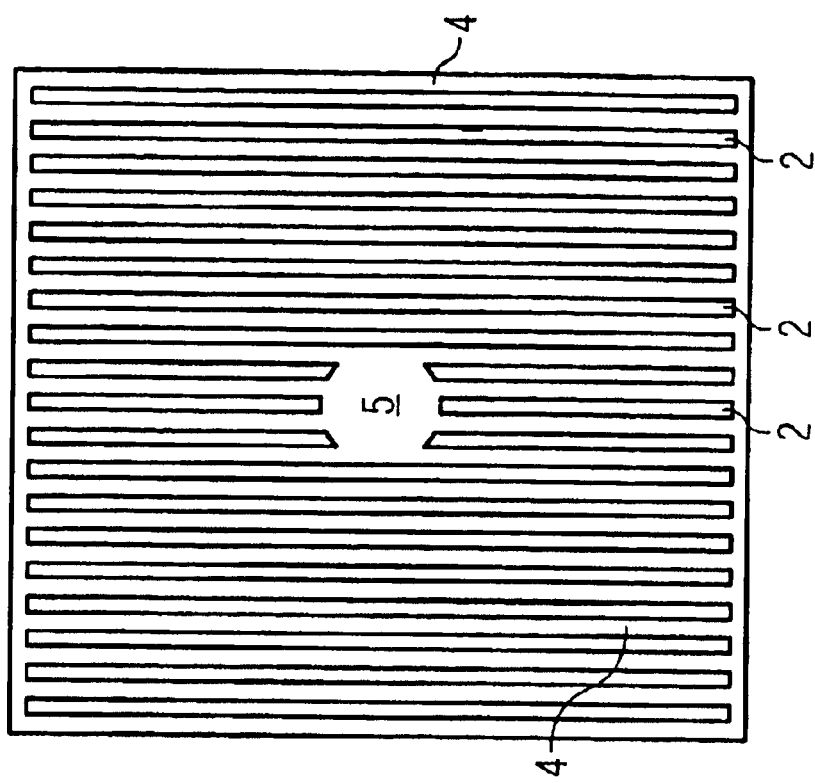

While FIGS. 1A to 1C show exemplary embodiments in which the regions 4, 5 are not cohesive, FIG. 2 shows an exemplary embodiment with cohesive regions 4, 5, where numerous narrow p-doped regions 4 are embedded in the n-doped semiconductor body 2, with the entire edge being p-doped. A region 5 having a greater minimum extent is square or rectangular, and is located essentially in a central area of the diode. A total of four strips 4 are directly cohesive in this region 5.

Figure 3:
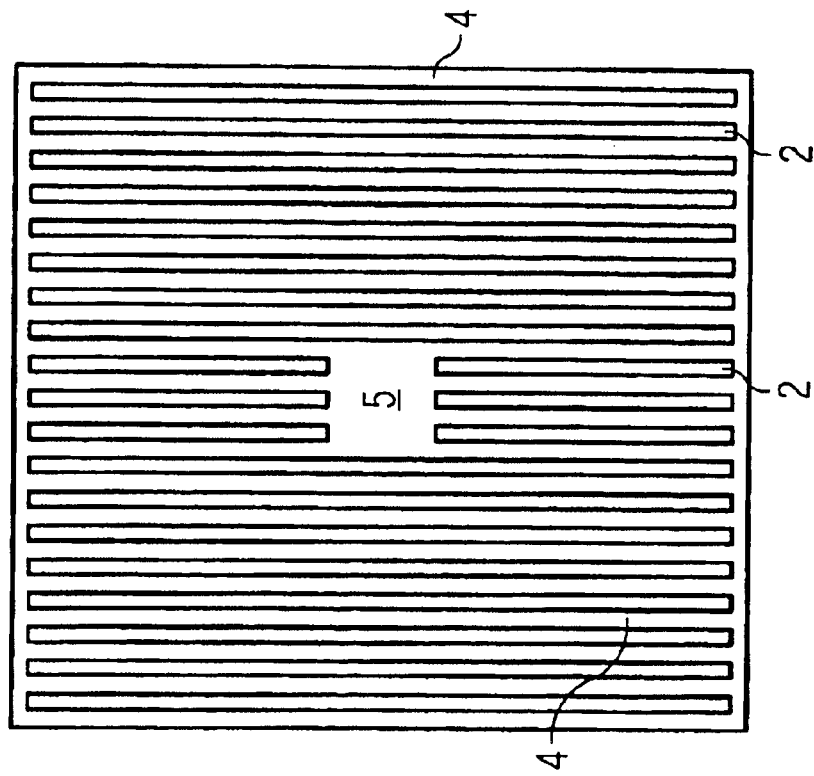
Figure 4:
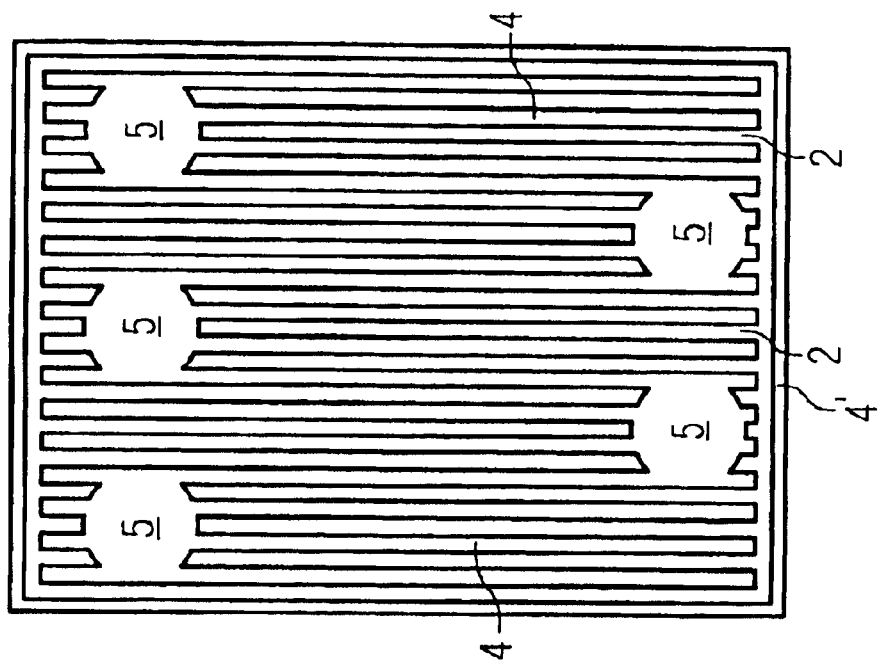

The region 5 may have any desired shape. For example, as is illustrated in FIG. 3, it may even be essentially round. It is, of course, also possible for there to be two or more such regions 5. One example of this is illustrated in FIG. 4. In the exemplary embodiment shown in FIG. 4, the regions 5 do not extend as far as the edge. In fact, the edge is in this case formed by a separate p-conductive region 4'.

Figure 5:
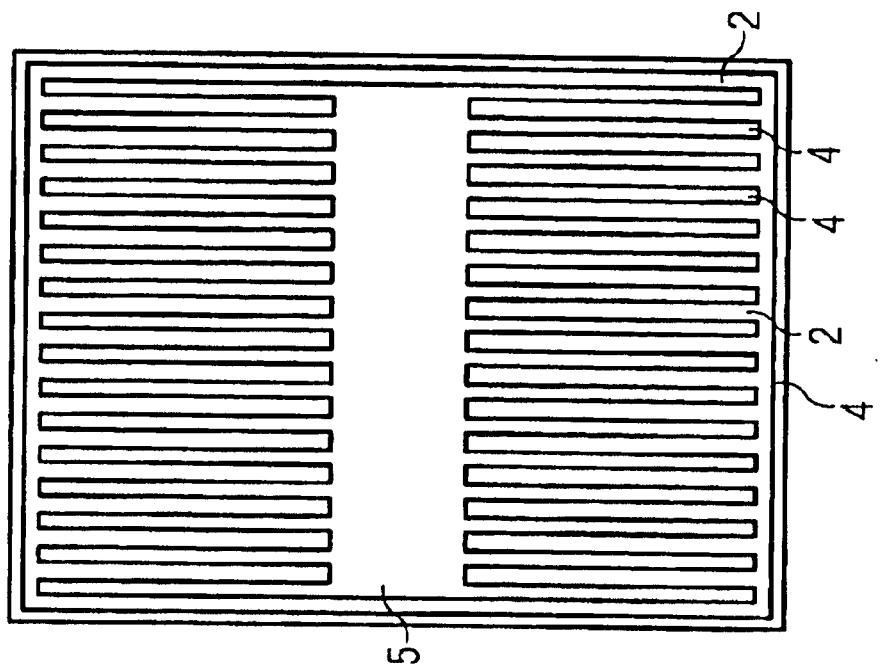

FIG. 5 shows an exemplary embodiment of the Schottky diode according to the invention, in which narrow regions 4 which are in the form of strips extend like combs on both sides from a large region 5. The edge in the exemplary embodiment shown in FIG. 5 is also formed by a separate p-conductive region 4', in the same way as in the exemplary embodiment shown in FIG. 4.

While the regions 4, 5 are cohesive in the exemplary embodiments shown in FIGS. 2 to 5, FIG. 6 shows an exemplary embodiment which is similar to FIG. 1, and in which two narrow regions 4 which are in the form of strips and a broad region 5 which is in the form of a strip in each case alternate with one another in the layer 2, with the regions 4, 5 not being cohesive. The edge is once again formed by a p-conductive region 4'.

FIG. 7 shows a further exemplary embodiment with regions 4, 5 which are not cohesive, and in which a small number of large square regions 5 are in each case provided as a starting area, while the regions 4 are considerably smaller, and occupy the rest of the surface of the layer 2. In this case as well, a p-conductive region 4' is provided as the edge.

FIG. 8 shows another, final, exemplary embodiment of the invention, in which the region 5 forms the edge and has a structure in the shape of a sawtooth. In this case, numerous small regions 4 are provided within the region 5.

What is claimed is:

1. A Schottky diode comprising:
   a semiconductor body of a first conductance type;
   a Schottky contact which is provided on the semiconductor body;
   and two or more regions of the other conductance type located in the semiconductor body (1, 2) underneath and are at least partially adjacent to the Schottky contact (6) wherein,
   in order to initiate the injection of a starting current, each of a first set of regions of the two or more regions has a minimum distance (D) between its center of the first region and an area of the first conductance type is considerably greater than the corresponding minimum distance (d) between each of a second set of regions of the two or more regions and the area of the first conductance type.

2. The Schottky diode as claimed in claim 1, wherein each of the first set of regions has a larger area than the respective areas of each of the second set of regions.

3. The Schottky diode as claimed in claim 1, wherein at least one of the first set of regions and at least one of the second set of regions are at least partially cohesive.

4. The Schottky diode as claimed in claim 1, wherein the two or more regions of the other conductance type are at least partially in the form of strips, and at least two regions which are in the form of strips are connected to one another via at least one of the first set of regions.

5. The Schottky diode as claimed in claim 4, wherein at least one of the first set of regions has a shape that is one of the set of rectangular, square, round and oval.

6. The Schottky diode as claimed in claim 1, wherein at least one of the two or more regions of the other conductance type forms an annular region disposed at an edge of the Schottky contact.

7. The Schottky diode as claimed in claim 1, wherein at least one of the first set of regions is provided at an edge of the Schottky contact.

8. The Schottky diode as claimed in claim 7, wherein at least one of the first set of regions has a sawtooth shape.

9. The Schottky diode as claimed in claim 7, where the second set of regions are incorporated in an area which is surrounded by at least one of the first set of regions.

10. The Schottky diode as claimed in claim 9, wherein each of the second set of regions have a shape that is one of the set of rectangular, square and round.

11. The Schottky diode as claimed in claim 1, wherein the two or more regions of the other conductance type have a shape that is one of the set of square and rectangular.

12. The Schottky diode as claimed in claim 4, wherein at least some of the second set of region which are in the form of strips extend in a parallel manner from at least one of the first set of regions.

13. The Schottky diode as claimed in claim 1, wherein the Schottky contact has an interrupted configuration.

14. The Schottky diode as claimed in claim 1, wherein the Schottky contact is constructed of titanium.

15. The Schottky diode as claimed in claim 1, further comprising an opposing electrode disposed opposite of the Schottky contact, the opposing electrode constructed of nickel.

16. The Schottky diode as claimed in claim 1, wherein the first conductance type is the n-conductance type.

17. The Schottky diode as claimed in claim 1, wherein the semiconductor body is composed of silicon or silicon carbide.

18. A Schottky diode comprising:
   a semiconductor body of a first conductance type;
   a Schottky contact which is provided on the semiconductor body (1, 2);
   and two or more regions of the other conductance type located in the semiconductor body (1, 2) underneath and are at least partially adjacent to the Schottky contact wherein,
   in order to initiate the injection of a starting current, each of a first set of regions of the two or more regions has a minimum distance (D) between its center of the first region and an area of the first conductance type is considerably greater than the corresponding minimum distance (d) between each of a second set of regions of the two or more regions and the area of the first conductance type, wherein
   the minimum distance (D) is chosen such that the at least one region acts as a starting area, and results in the injection of starting current.

19. The Schottky diode as claimed in claim 1, where the center of at least one of the first set of regions is not exclusively located in a transitional area between an active are of the Schottky diode and an edge area.

20. A Schottky diode having a semiconductor body (1, 2) of a first conductance type, having a Schottky contact (6) which is provided on the semiconductor body (1, 2), and having two or more regions (4, 5) of the other conductance type, which are located in the semiconductor body (1, 2) underneath the Schottky contact (6) and are at least partially adjacent to the Schottky contact (6), wherein in order to initiate the injection of a starting current, each of a first set of regions of the two or more regions has a minimum distance (D) between its center of the first region and an area of the first conductance type is considerably greater than the corresponding minimum distance (d) between each of a second set of regions of the two or more regions and the area of the first conductance type, and wherein
   the center of at least one of the first set of regions is not exclusively located in a transitional area between an active are of the Schottky diode and an edge area.

* * * * *